US012684946B2

(12) United States Patent
Han et al.

(10) Patent No.: US 12,684,946 B2
(45) Date of Patent: Jul. 14, 2026

(54) LIGHT EMITTING DISPLAY DEVICE

(71) Applicant: LG Display Co., Ltd., Seoul (KR)

(72) Inventors: Jun Hee Han, Paju-si (KR); Yong Min Park, Paju-si (KR); Yoon Seob Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 485 days.

(21) Appl. No.: 18/476,177

(22) Filed: Sep. 27, 2023

(65) Prior Publication Data

US 2024/0224585 A1 Jul. 4, 2024

(30) Foreign Application Priority Data

Dec. 28, 2022 (KR) ........................ 10-2022-0187793

(51) Int. Cl.
| | |
|---|---|
| *H10K 59/12* | (2023.01) |
| *H10K 59/121* | (2023.01) |
| *H10K 59/80* | (2023.01) |
| *H10K 59/82* | (2023.01) |
| H10K 102/00 | (2023.01) |

(52) U.S. Cl.
CPC ..... *H10K 59/1201* (2023.02); *H10K 59/1213* (2023.02); *H10K 59/82* (2023.02); *H10K 59/87* (2023.02); *H10K 2102/302* (2023.02)

(58) Field of Classification Search
CPC ........... H10K 59/1201; H10K 59/1213; H10K 59/82; H10K 59/87; H10K 2102/302;

H10K 59/131; H10K 71/861; H10K 59/124; H10K 59/123; H10K 59/80515; H10K 59/8052; H10K 2102/341
See application file for complete search history.

(56) References Cited

U.S. PATENT DOCUMENTS

| | | | | |
|---|---|---|---|---|
| 9,257,071 B2 | 2/2016 | Kimura | | |
| 2007/0001941 A1* | 1/2007 | Umezaki | .............. | G09G 3/3266 |
| | | | | 345/77 |
| 2013/0321249 A1* | 12/2013 | Kimura | ................ | G09G 3/3233 |
| | | | | 345/76 |
| 2016/0049454 A1* | 2/2016 | Park | ..................... | H10K 59/126 |
| | | | | 257/40 |
| 2016/0240142 A1* | 8/2016 | Jeong | ................... | G09G 3/3233 |
| 2018/0342570 A1* | 11/2018 | Hong | ................... | H10K 59/352 |

FOREIGN PATENT DOCUMENTS

KR 10-2187904 B1 12/2020

* cited by examiner

*Primary Examiner* — Syed I Gheyas
(74) *Attorney, Agent, or Firm* — Fenwick & West LLP

(57) ABSTRACT

The light emitting display device of the present disclosure prevents a bright spot due to overcurrent through a switch that performs automatic switching operation when the overcurrent occurs in a thin film transistor connected to a light emitting element. The light emitting display device according to an embodiment of the present disclosure includes a light emitting element including an anode, an emission layer, and a cathode, a reference line overlapping the anode, and a passivation layer provided between the anode and the reference line and having at least one breakdown part in a first region where the anode and the reference line overlap.

20 Claims, 11 Drawing Sheets

N1 : N1a, N1b, N1c
N2 : N2a, N2b

LIGHT EMITTING DISPLAY DEVICE

CROSS REFERENCE TO RELATED APPLICATION

This application claims the benefit of Republic of Korea Patent Application No. 10-2022-0187793, filed on Dec. 28, 2022, which is hereby incorporated by reference in its entirety.

BACKGROUND

Technical Field

The present disclosure relates to a display device, and more particularly, to a light emitting display device in which a switch for preventing or at least reduce bright spots due to overcurrent is provided in a sub-pixel.

Discussion of the Related Art

Recently, displays that visually represent electrical information signals have developed rapidly in the information age, and accordingly, various display devices with excellent performance which are thin and light and have low power consumption have been developed and are rapidly replacing existing cathode ray tubes (CRTs).

There among, a light emitting display device that does not require a separate light source and includes light emitting elements in a display panel without having a separate light source for a compact device configuration and vivid color display is considered as a competitive application.

SUMMARY

Light emitting display devices are inspected before release, and if defective sub-pixels are detected in the inspection stage, a repair process is performed to darken the sub-pixels.

After completion of the process, even if a defect such as a bright spot is generated in the display device, it is difficult to repair the bright spot internally.

The present disclosure provides a light emitting display device including an automatic switch having breakdown characteristics at an overlapping portion of an anode and a reference line to darken a light emitting element using the automatic switch when overcurrent is generated in a pixel circuit.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A light emitting display device of the present disclosure prevents or at least reduces, when overcurrent occurs in a sub-pixel, the overcurrent from affecting a light emitting element by using breakdown characteristics of an overlapping insulating layer of another node provided in the sub-pixel as an automatic switch function, thereby preventing or at least reducing abnormal visual recognition.

A light emitting display device according to an embodiment of the present disclosure includes a light emitting element including an anode, an emission layer, and a cathode, a reference line overlapping the anode, and a passivation layer provided between the anode and the reference line and having at least one breakdown part in a first region where the anode and the reference line overlap.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
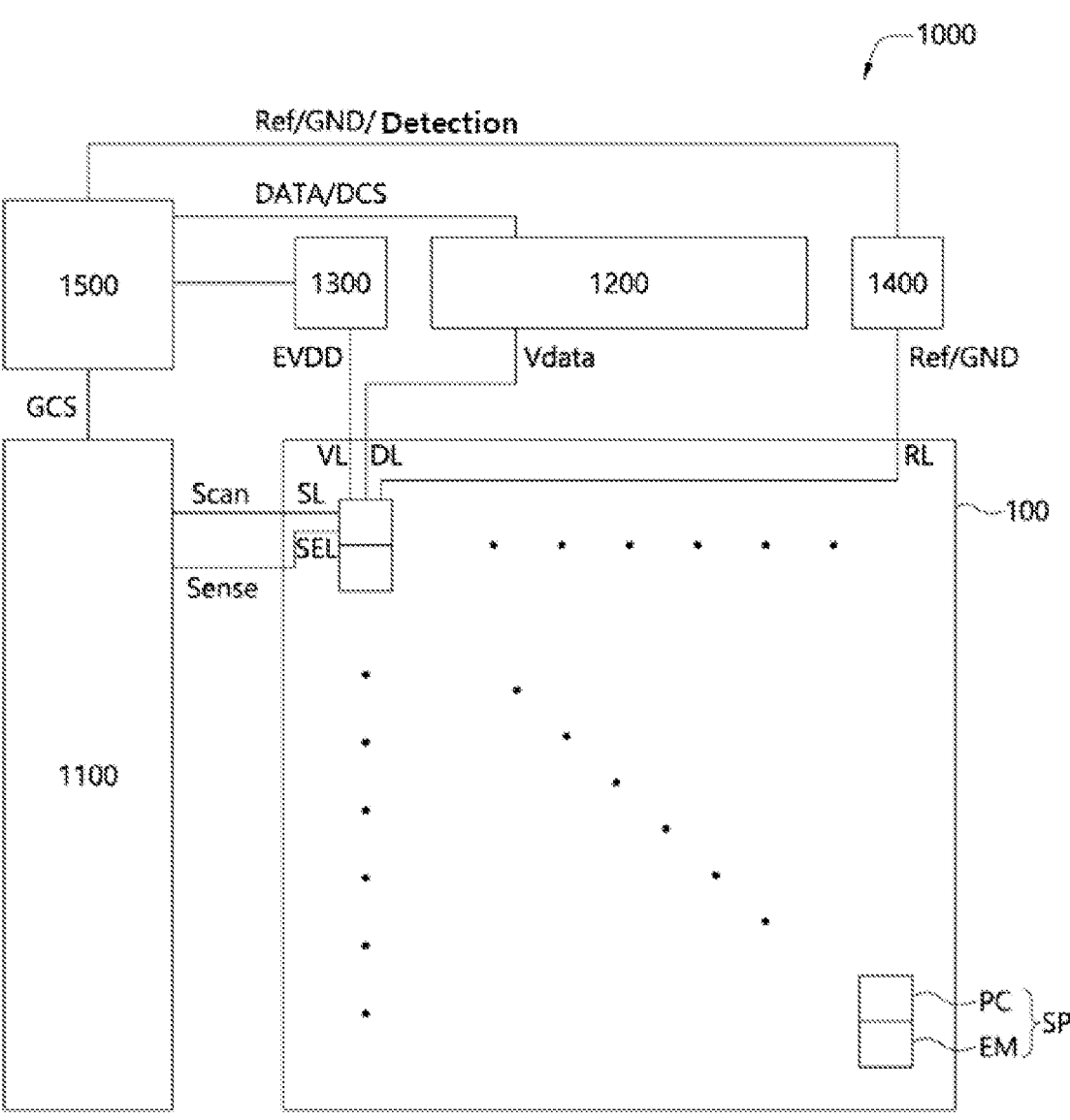
FIG. 1 is a schematic diagram illustrating a light emitting display device according to an embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts, unless otherwise specified.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and may be embodied in various different forms. Thus, these example embodiments are set forth only to make the present disclosure sufficiently complete, and to assist those skilled in the art to fully understand the scope of the present disclosure. The protected scope of the present disclosure is defined by the claims and their equivalents.

In the following description of the present disclosure, where the detailed description of the relevant known steps, elements, functions, technologies, and configurations may unnecessarily obscure an important point of the present disclosure, a detailed description of such steps, elements, functions, technologies, and configurations maybe omitted. In addition, the names of elements used in the following description are selected in consideration of clarity of description of the specification, and may differ from the names of elements of actual products. Furthermore, in the following detailed description of the present disclosure, numerous specific details are set forth in order to provide a sufficiently thorough understanding of the present disclosure. However, it will be understood that the present disclosure may be practiced without these specific details. In other instances, known methods, procedures, components, and circuits have not been described in detail so as not to unnecessarily obscure aspects of the present disclosure.

The shapes, sizes, ratios, angles, numbers, and the like, which are illustrated in the drawings to describe various example embodiments of the present disclosure are merely given by way of example. The disclosure is not limited to the illustrations in the drawings.

In the present specification, where terms such as "including," "having," "comprising," and the like are used, one or more components may be added, unless the term, such as "only," is used. As used herein, the term "and/or" includes a single associated listed item and any and all of the combinations of two or more of the associated listed items.

An expression such as "at least one of" when preceding a list of elements may modify the entire list of elements and may not modify the individual elements of the list. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In construing a component or numerical value, the component or the numerical value is to be construed as including an error or tolerance range even where no explicit description of such an error or tolerance range is provided.

In describing the various example embodiments of the present disclosure, where the positional relationship between two elements is described using terms, such as "on", "above", "under" and "next to", at least one intervening element may be present between the two elements, unless "immediate(ly)" or "direct(ly)" or "close(ly) is used. It will be understood that when an element or layer is referred to as being "connected to", or "coupled to" another element or layer, it may be directly connected to or coupled to the other element or layer, or one or more intervening elements or layers may be present.

In describing the various example embodiments of the present disclosure, when terms such as "after," "subsequently," "next," and "before," are used to describe the temporal relationship between two events, another event may occur therebetween, unless a more limiting term, such as "just," "immediate(ly)," or "directly" is used.

In describing the various example embodiments of the present disclosure, terms such as "first" and "second" may be used to describe a variety of components. These terms aim to distinguish the same or similar components from one another and do not limit the components. Accordingly, throughout the specification, a "first" component may be the same as a "second" component within the technical concept of the present disclosure, unless specifically mentioned otherwise.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, preferred embodiments of the present disclosure will be described with reference to the accompanying drawings.

Figure 2:
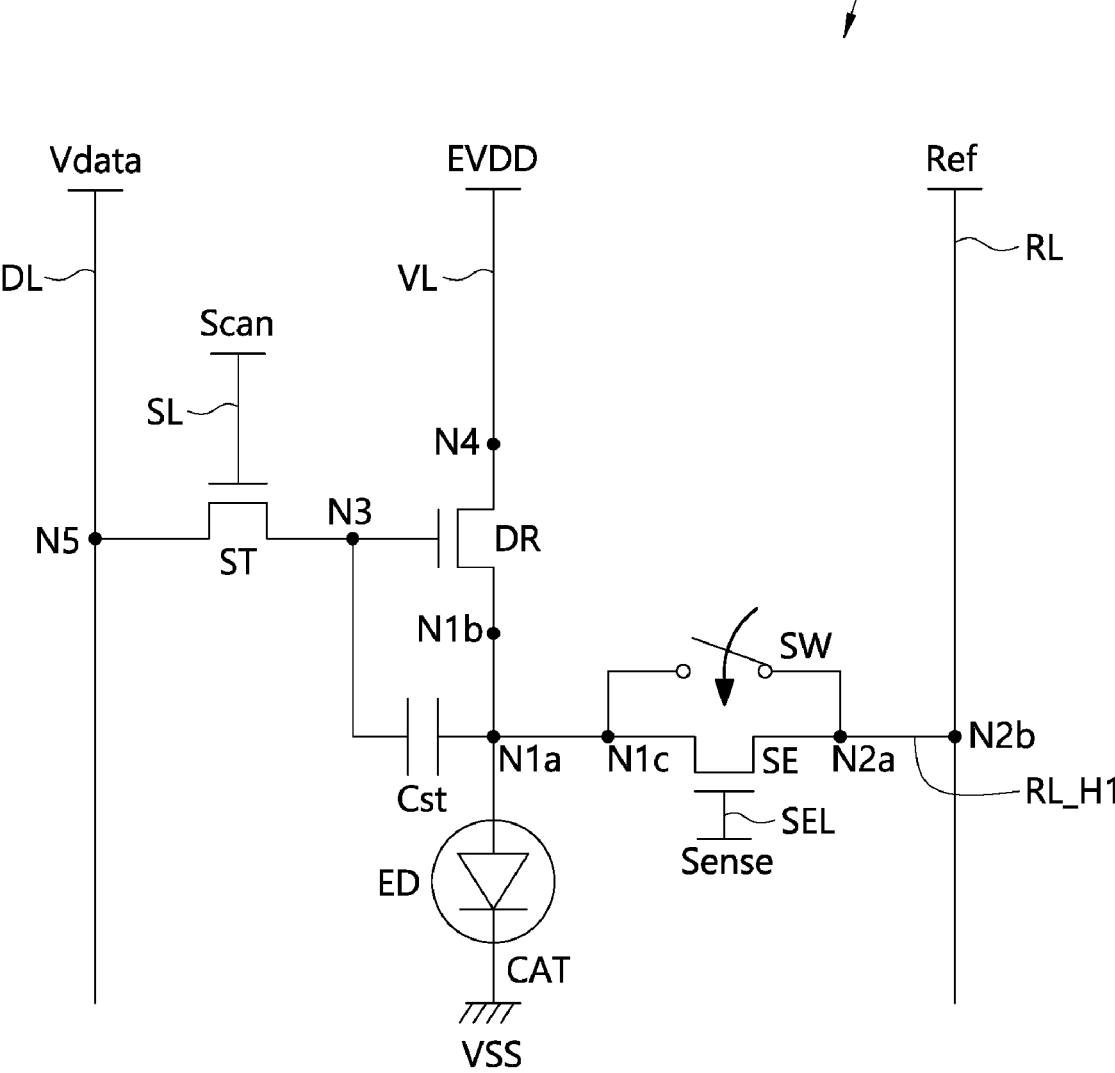
FIG. 2 is a circuit diagram illustrating a pixel circuit of the light emitting display device according to an embodiment of the present disclosure.

FIG. 1 is a schematic diagram illustrating a light emitting display device of the present disclosure, and FIG. 2 is a circuit diagram illustrating a pixel circuit of the light emitting display device of the present disclosure.

Referring to FIG. 1, the light emitting display device 1000 of the present disclosure may include a substrate 100 including a plurality of sub-pixels SP, a scan driving circuit 1100, a data driving circuit 1200, a timing controller 1500, a driving voltage supply 1300 (also referred to as a driving power supply or a driving power supply unit), and a sensing unit 1400 which are connected to the substrate 100.

The substrate 100 includes a plurality of scan lines SL and a plurality of data lines DL that intersect each other, and a plurality of sub-pixels SP is disposed at intersections of the scan lines SL and the data lines DL. Each sub-pixel SP includes a pixel circuit PC as illustrated in FIG. 2.

As illustrated in FIG. 2, the pixel circuit PC provided in each sub-pixel SP may include a light emitting element ED, a driving transistor DR connected to an anode N1a of the light emitting element ED to apply a driving current, a switching transistor ST for transferring a data voltage Vdata to the gate electrode of the driving transistor DR, that is, a third node N3, a storage capacitor Cst for maintaining a constant voltage for one frame, and a sensing transistor SE provided between the anode N1a of the light emitting element ED and a reference line RL to sense a voltage of a first node N1 (N1a, N1b, and N1c) to which the anode N1a and the driving transistor DR are connected. Further, a first electrode N1c and a second electrode N2a, which are both electrodes of the sensing transistor SE, serve as both nodes of the switch SW, and the gate electrode of the sensing transistor SE is connected to a sensing line SEL to receive a sensing signal SENSE. The second electrode N2a of the sensing transistor SE is electrically connected to a node N2b of the reference line RL. The second electrode N2a and the node N2b of the reference line RL may be a horizontal part RL_H1 of the reference line RL and may have the same voltage level as a second node N2, and the voltage can be transferred to the reference line RL.

The driving transistor DR includes a third electrode N1b and a fourth electrode N4 with a gate electrode interposed therebetween, the third electrode N1b may be connected to the anode Na of the light emitting element ED and the first electrode N1c of the sensing transistor SE, and the fourth electrode N4 may be connected to a driving voltage line VL. Accordingly, the third electrode N1$b$, the anode N1$a$, and the first electrode N1$c$ of the sensing transistor SE have the same voltage level by being electrically connected to the first node of the switch SW. The third electrode N1$b$, the anode N1$a$, and the first electrode N1$c$ of the sensing transistor SE can correspond to the first node N1 because they have the same voltage level. Here, the third electrode N1$b$, the anode N1$a$, and the first electrode N1$c$ may be integrally formed at the first node N1, or some thereof may be integrally formed. For example, the third electrode N1$b$ of the driving transistor DR and the first electrode N1$c$ of the sensing transistor SE may be integrated into a single node. In addition, the anode N1$a$ may overlap with at least one of the third electrode N1$b$ of the driving transistor DR and the first electrode N1$c$ of the sensing transistor SE to be electrically connected thereto in plan view.

One of the first electrode N1$c$ and the second electrode N2$a$ of the sensing transistor SE may be a source electrode and the other may be a drain electrode.

One of the third electrode N1$b$ and the fourth electrode N4 of the driving transistor DR may be a source electrode and the other may be a drain electrode. Further, the fourth electrode N4 of the driving transistor DR is connected to the driving voltage line VL to receive a driving voltage signal EVDD.

A fifth electrode and a sixth electrode of the switching transistor ST are connected to a data line DL and the gate electrode of the driving transistor through a fifth node N5 and the third node N3, respectively.

The switching transistor ST has the fifth electrode and the sixth electrode with a gate electrode interposed therebetween, and the fifth electrode is connected to the data line DL through the fifth node N5. The switching transistor ST operates by receiving a scan signal Scan through the gate electrode. The sixth electrode is connected to the gate electrode of the driving transistor DR at the third node N3.

The storage capacitor Cst may be provided between the third node N3 and the first node N1 (N1$a$, N1$b$, and N1$c$).

The light emitting element ED may include the anode N1$a$, a functional layer, and a cathode. The anode N1$a$ is electrically connected to the third electrode N1$b$ of the driving transistor DR and the light emitting element ED can operate by receiving a current flowing through the driving voltage line VL through the anode N1$a$ when the driving transistor DR is turned on. A ground voltage VSS may be applied to the cathode.

The functional layer of the light emitting element ED includes an emission layer, and may further include a hole related common layer and an electron related common layer in addition to the emission layer. When the main ingredient of the functional layer is an organic material, the light emitting element ED may be referred to as an organic light emitting element.

The light emitting display device of the present disclosure is not limited to examples including an organic light emitting element, and may also be applied to examples including a light emitting element including a functional layer made of an inorganic material or a hybrid layer including an organic material and an inorganic material.

A configuration for driving each sub-pixel SP in the light emitting display device 1000 will be described.

The gate driving circuit 1100 controls driving timing of the sub-pixels SP disposed on the substrate 100. Further, the data driving circuit 1200 supplies a data voltage Vdata corresponding to image data to the sub-pixels SP. As a result, the sub-pixels SP display an image by emitting light with a luminance corresponding to the gray level of the image data.

Specifically, the scan driving circuit 1100 is controlled by the timing controller 1500 and sequentially outputs a scan signal Scan to the plurality of scan lines SL disposed on the substrate 100 to control driving timing of the plurality of sub-pixels SP.

In some cases, the scan driving circuit 1100 may also sequentially supply a sensing signal Sense to sensing lines SEL. When the scan driving circuit 1100 supplies the sensing signal Sense to the sensing lines SEL, the scan driving circuit 1100 may supply the scan signal Scan and the sensing signal Sense simultaneously or at predetermined intervals. The present disclosure is not limited thereto, and a sensing signal provider may be provided independently of the scan driving circuit 1100 to sequentially supply the sensing signal Sense to the sensing lines SEL.

The scan driving circuit 1100 may include one or more gate driving integrated circuits (GDICs), and may be located on only one side of the substrate 100 or on both sides depending on the driving method. Alternatively, the scan driving circuit 1100 may be implemented in a gate-in-panel (GIP) structure by being directly embedded in a bezel area of the substrate 100.

The data driving circuit 1200 receives digital image data DATA from the timing controller 1500 and converts the image data into an analog data voltage Vdata. In addition, the data driving circuit 1200 outputs the data voltage to each data line DL at the timing when the scan signal is applied through the scan lines SL, such that each sub-pixel SP expresses luminance according to the data voltage Vdata.

The data driving circuit 1200 may include one or more source driving integrated circuits (SDICs).

The driving power supply 1300 supplies a driving voltage signal EVDD to the driving power line VL of the sub-pixel.

The sensing unit 1400 is connected to the reference line RL of the sub-pixel SP, detects the voltage of the first node N1 of the sub-pixel SP through the reference line RL, and may sense the degree of deterioration of the driving transistor DR. If overcurrent is generated at the first node N1, the overcurrent escapes through the reference line RL according to connection of the first electrode N1$c$ and the second electrode N2$a$ of the switch SW, and the sensing unit 1400 supplies the ground voltage in the switch-on state such that the ground voltage is applied to the anode N1$a$ connected to the first electrode N1$c$ of the switch SW. Accordingly, the ground voltage can be supplied to the anode N1$a$ of the light emitting element ED to darken the light emitting element ED.

The timing controller 1500 supplies various control signals to the scan driving circuit 1100, the data driving circuit 1200, the driving power supply 1300, and the sensing unit 1400, and the scan driving circuit 1100 and the data driving circuit 1200, control the operation of the driving power supply unit 1300 and the sensing unit 1400.

The timing controller 1500 causes the scan driving circuit 1100 to output a scan signal Scan and a sensing signal Sense according to timing of each frame, converts image data received from the outside in accordance with a data signal format used in the data driving circuit 1200, and outputs the converted image data DATA to the data driving circuit 1200.

The timing controller 1500 receives various timing signals including a vertical synchronization signal, a horizontal synchronization signal, an input data enable signal, and a clock signal from the outside (e.g., a host system) along with the image data DATA.

The timing controller 1500 may generate a data control signal DCS and a gate control signal GCS using various timing signals received from the outside and output the same to the data driving circuit 1200 and the scan driving circuit 1100, respectively.

For example, the timing controller 1500 outputs various gate control signals GCS including a gate start pulse, a gate shift clock, a gate output enable signal, and the like to control the scan driving circuit 1100.

Here, the gate start pulse controls a start timing of one or more gate driving integrated circuits constituting the scan driving circuit 1100. The gate shift clock is a clock signal commonly input to the one or more gate driving integrated circuits and controls a shift timing of the scan signal Scan. The gate output enables signal specifies timing information of the one or more gate driving integrated circuits.

In addition, the timing controller 1500 outputs various data control signals DCS including a source start pulse, a source sampling clock, a source output enable signal, and the like to control the data driving circuit 1200.

Here, the source start pulse controls a data sampling start timing of one or more source driving integrated circuits constituting the data driving circuit 1200. The source sampling clock is a clock signal that controls a sampling timing of data in each source driving integrated circuit. The source output enable signal controls an output timing of the data driving circuit 1200.

Figure 3:
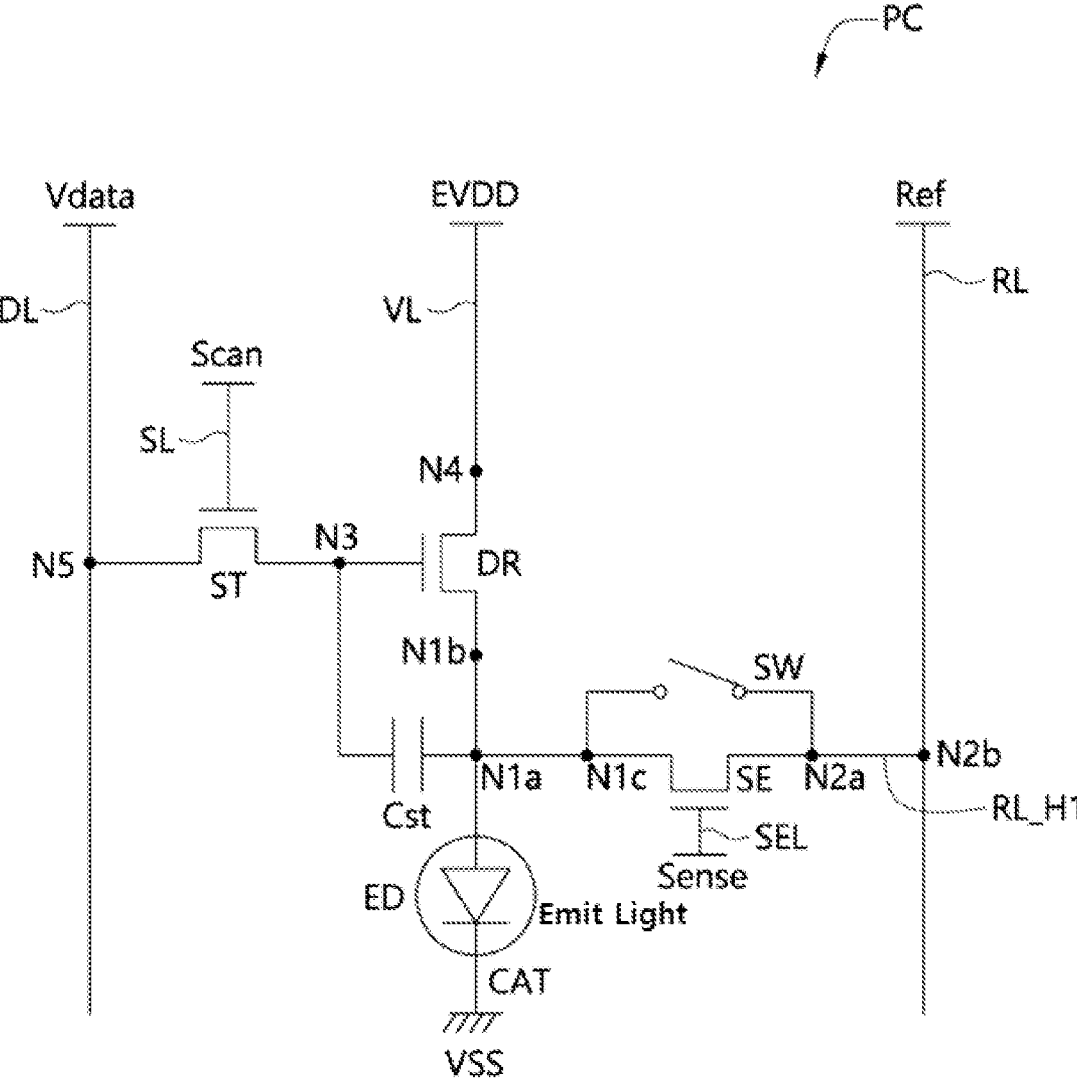
FIG. 3 is a circuit diagram illustrating a normal emission state in the light emitting display according to an embodiment of the present disclosure.
Figure 4:
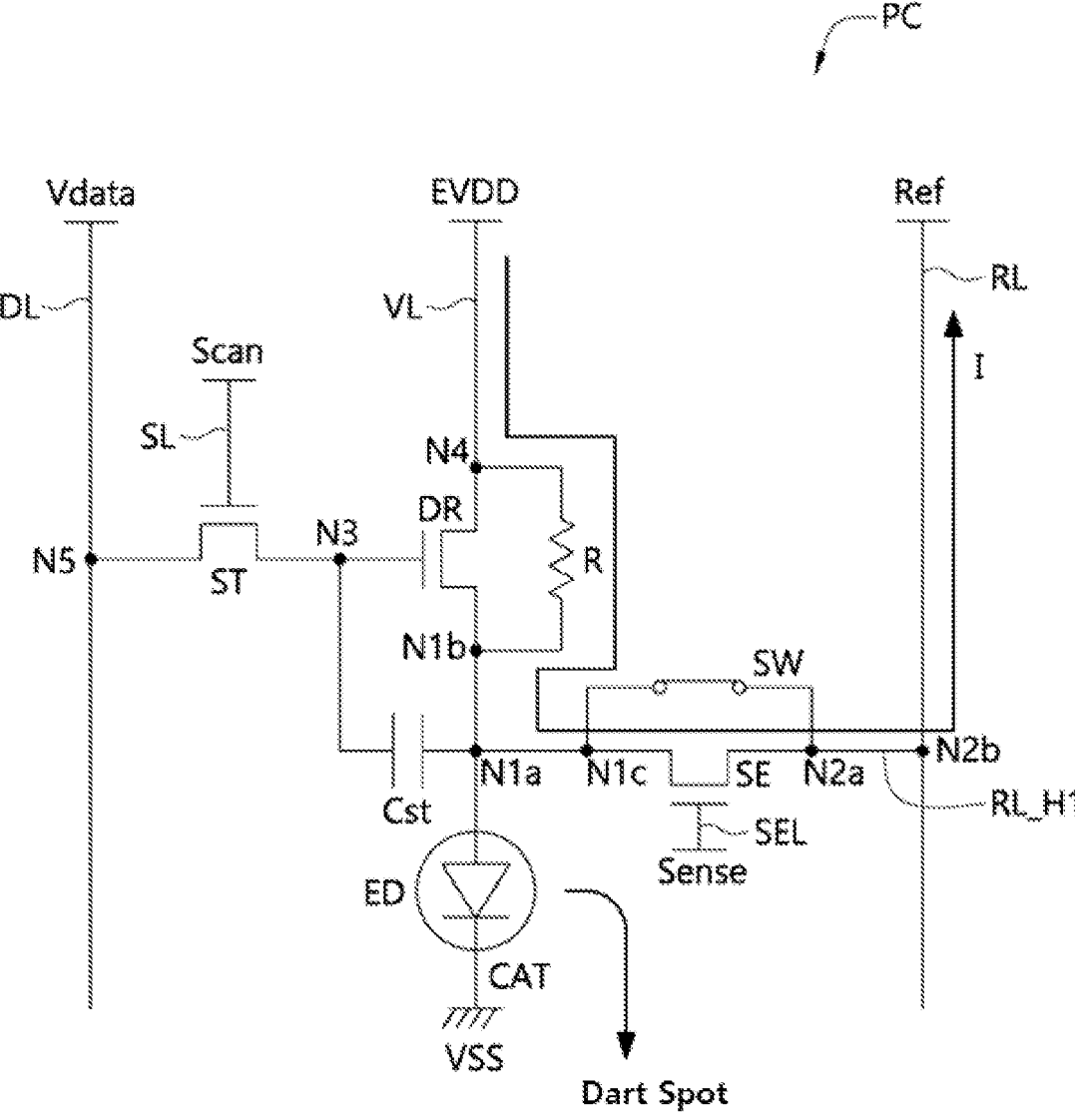
FIG. 4 is a circuit diagram illustrating a darkened state in the light emitting display device according to an embodiment of the present disclosure.
Figure 5A:
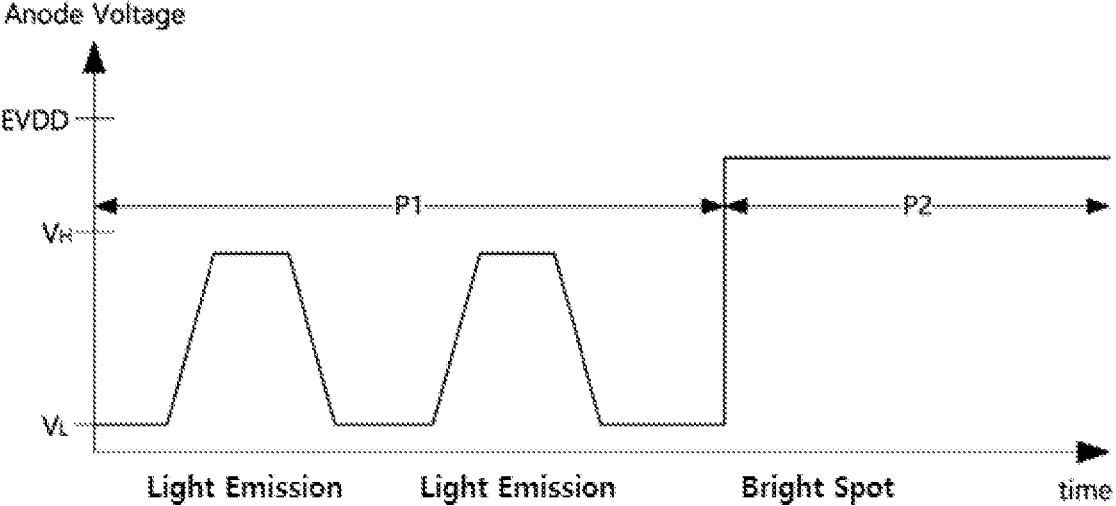
FIGS. 5A and 5B are timing diagrams illustrating voltage changes in anodes of a light emitting display device of a first experimental example Ex1 and a light emitting display device of a second experimental example Ex2 according to an embodiment of the present disclosure.
Figure 5B:
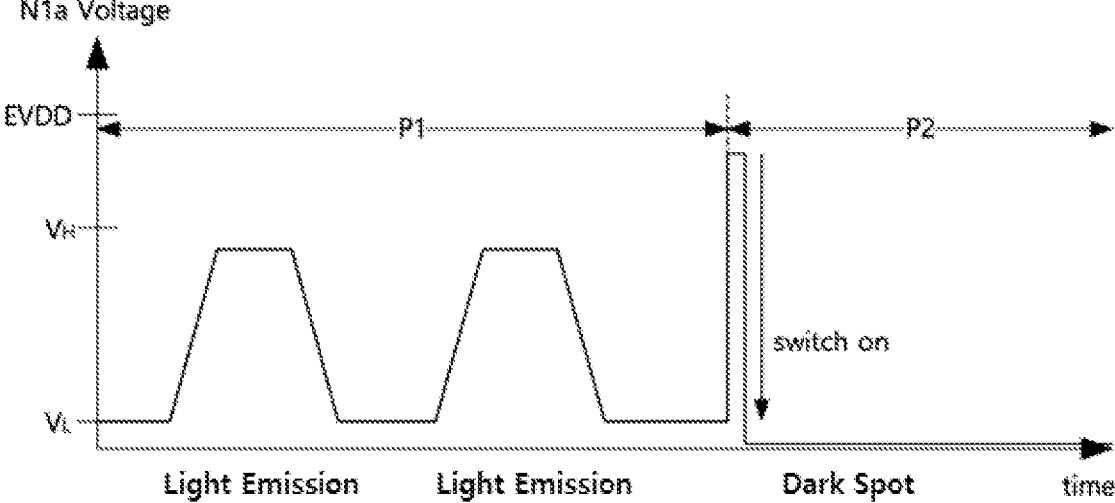

FIG. 3 is a circuit illustrating a normal emission state in the light emitting display device of the present disclosure, and FIG. 4 is a circuit diagram illustrating a darkened state in the light emitting display device of the present disclosure. FIGS. 5A and 5B are timing diagrams illustrating voltage changes in anodes of a light emitting display device of a first experimental example Ex1 and a light emitting display device of a second experimental example Ex2.

FIG. 5A is a timing diagram of the light emitting display device without having the switch according to the present disclosure in the first experimental example, in which a reference line and the anode have the same vertical separation distance in the overlapping region. That is, in the light emitting display of the first experimental example illustrated in FIG. 5A, an insulating layer provided between the reference line and the anode has the same thickness between the reference line and the anode. FIG. 5B is a timing diagram of the light emitting display device having the switch according to the present disclosure in the second experimental example, which differs from the experimental example of FIG. 5A in that the light emitting display device includes the switch operating due to overcurrent and/or overvoltage illustrated in FIGS. 2 to 4.

An operation of the pixel circuit PC in a normal state will be described with reference to FIGS. 3 and 5.

As illustrated in FIGS. 5A and 5B, in a first period P1 in which normal operation is performed, the light emitting elements are normally turned on/off according to a voltage level applied to the anodes in both the first experimental example shown in FIG. 5A and the second experimental example shown in FIG. 5B. In this case, the ground voltage or a low-level voltage is applied to the reference line RL, and thus the anode can operate by receiving a driving current from the driving transistor DT without being affected by the sensing transistor SE.

In the pixel circuit PC in a normal state, on/off of the switching transistor ST is controlled by the scan signal Scan applied through the scan line SL, and when the switching transistor ST between the fifth node N5 and the third node N3 is turned on, the driving transistor DR connected at the third node N3 is controlled.

That is, when the switching transistor ST is turned on by the scan signal Scan, the data voltage Data supplied through the data line DL is applied to the gate electrode of the driving transistor DR through the third node N3, and the voltage applied to the gate electrode changes from a low level VL to a high level VH. When the voltage applied to the gate electrode is equal to or greater than the threshold voltage of the driving transistor DR, the driving transistor is turned on and the driving current can be supplied to the light emitting element ED from the driving power line VL through the driving transistor DR. In addition, when the driving current is supplied to the light emitting element ED, the light emitting element ED is turned on to emit light normally.

In the first and second experimental examples, sensing through the reference line RL may be performed by supplying a sensing voltage through the reference line RL. At this time, the sensing voltage is less than the high level signal VH supplied to the anode, and the application of the sensing voltage does not affect whether or not the light emitting element emits light. When the sensing voltage is supplied through the reference line, the third electrode N1*b* of the driving transistor DR is connected to the first electrode N1*c* of the sensing transistor SE, voltage change in the first node N1 is sensed through the sensing unit 1400 connected to the reference line RL, and thus an abnormality of the driving transistor DR according to aging may be detected.

Sensing of the first node N1 through the reference line RL may be performed according to each application of a sensing signal SENSE. The sensing signal SENSE may be applied simultaneously with a scan signal Scan for each frame or may be applied at predetermined intervals. Alternatively, the sensing signal SENSE may be applied every plurality of frames.

When an electrical foreign material or the like occurs in the driving transistor DR as in a second period P2 of FIGS. 5A and 5B, this may act as a resistor R connected in parallel with the driving transistor DR, and thus a voltage higher than the operating voltage VH of the driving transistor DR, that is, close to the driving power supply voltage EVDD may be applied to the third electrode N1*b*, which is the output terminal of the driving transistor DR.

As illustrated in FIG. 5A, when the switch, which is the configuration of the present disclosure, is absent in the first experimental example, the high voltage of the third electrode N1*b* of the driving transistor DR is directly applied to the anode N1*a*. In this case, a high voltage higher than the high level signal VH is applied to the anode of the light emitting element, and thus the light emitting element may act as a bright spot emitting bright light. In addition, even if sensing is performed through the reference line in the first experimental example, the anode is directly connected to the electrical foreign material, and thus the sub-pixel in which the electrical foreign material has been infiltrated is not controlled by the driving transistor through the anode and is observed as a bright spot.

However, in the light emitting display device of the present disclosure in the second experimental example, even if high overvoltage and/or overcurrent occur at the first node N1*c*, N1*b* and N1*a* of the switch connected to the third electrode N1*b* of the driving transistor DR due to an electrical foreign material, an insulating layer provided between the anode and the overlapping reference line RL in the same sub-pixel has breakdown characteristics and thus the anode is immediately connected to the reference line in the second period P2 corresponding to an abnormal state, as illustrated in FIGS. 4 and 5B. This indicates a state in which the first node N1*c* and the second node N2 (N2*a*, N2*b*) of the switch SW of FIG. 4 are automatically connected. In this case, even if the anode is in contact with an electrical foreign material, the overvoltage and/or overcurrent of the first node N1c is immediately transferred to the reference line RL connected to the second node N2. Then, if overcurrent is detected when the voltage of the second node N2 is sensed through the reference line, when the ground voltage is immediately supplied through the reference line, the anode N1a in direct contact with the reference line becomes a ground state, and thus the light emitting element ED can be blackened. The reference line RL connected to the sub-pixel in which such darkening occurs continuously supplies the ground voltage after the voltage of the second node N2 is sensed to maintain darkening of the sub-pixel.

Hereinafter, the sub-pixel structure of the light emitting display device according to the present disclosure will be described in detail.

Figure 6:
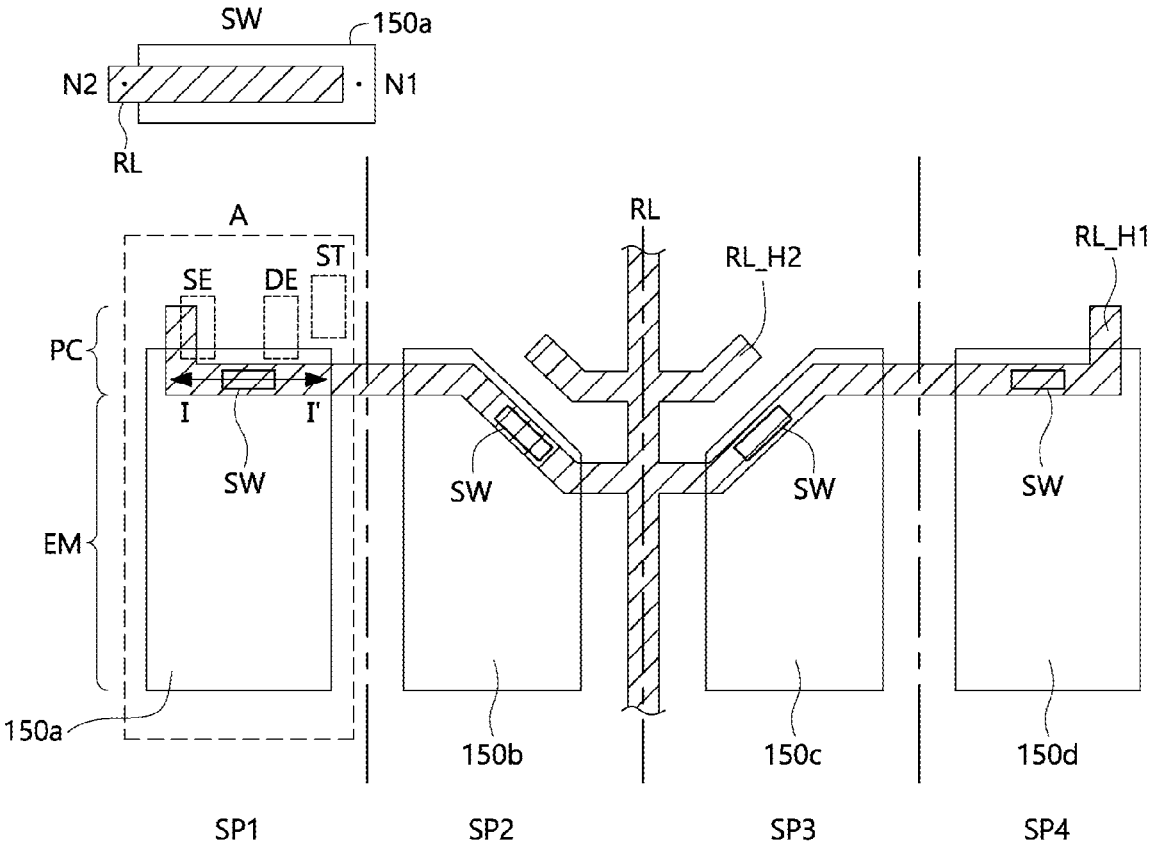
FIG. 6 is a plan view illustrating a switch of the light emitting display device according to an embodiment of the present disclosure.
Figure 7:
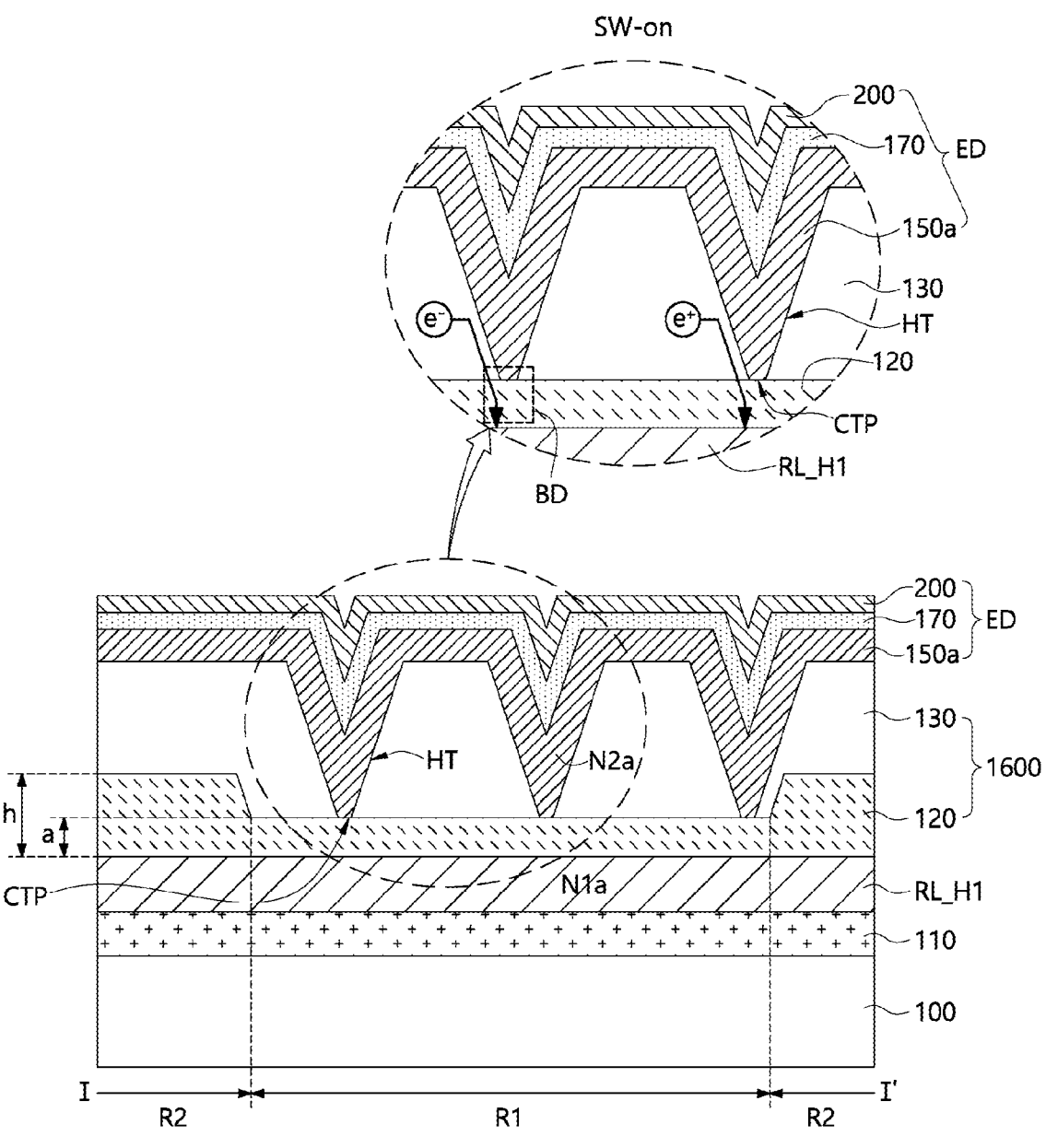
FIG. 7 is a cross-sectional view taken along line I-I' of FIG. 6 according to an embodiment of the present disclosure.
Figure 8:
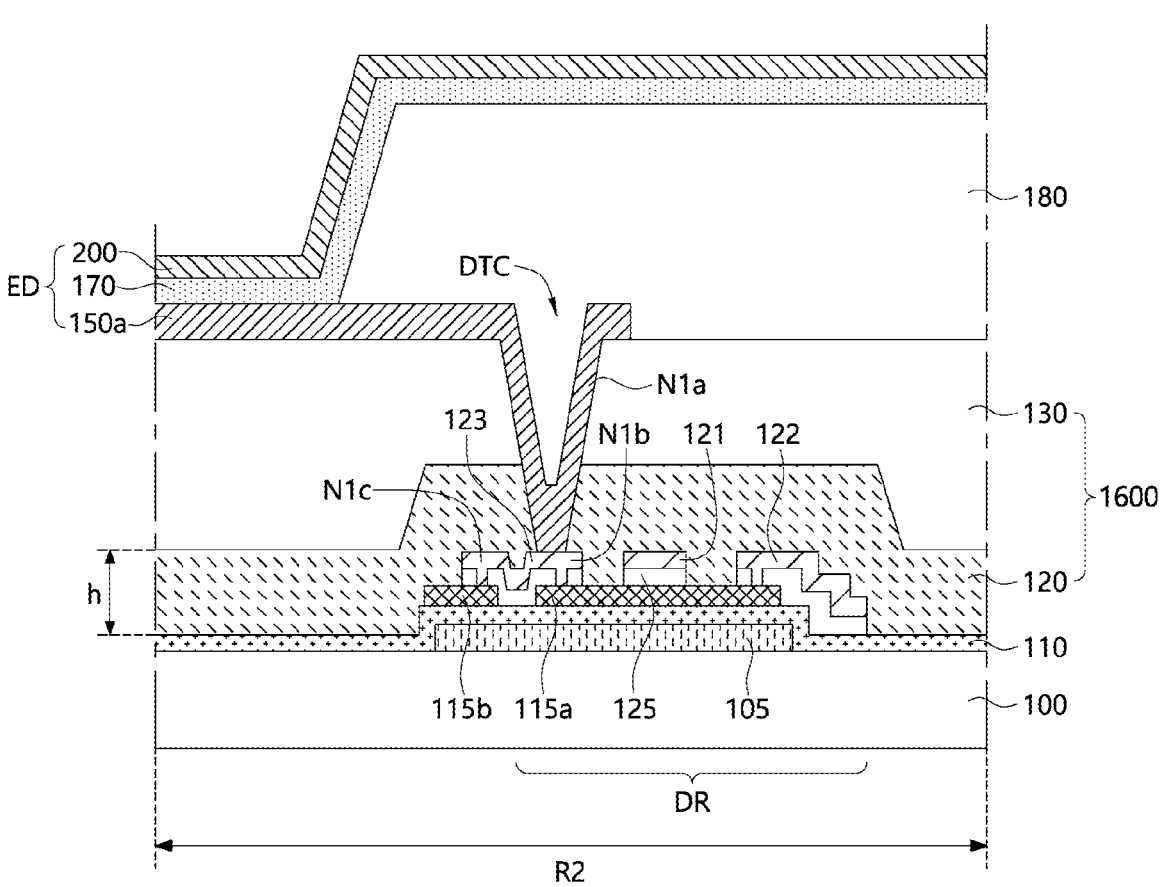
FIG. 8 is a cross-sectional view illustrating a driving transistor and an anode of the light emitting display device according to an embodiment of the present disclosure.

FIG. 6 is a plan view illustrating the switch of the light emitting display device according to the present disclosure, FIG. 7 is a cross-sectional view taken along line I-I' of FIG. 6, and FIG. 8 is a cross-sectional view illustrating a driving transistor and an anode of the light emitting display device according to an embodiment of the present disclosure.

As illustrated in FIGS. 6 to 8, the light emitting display device of the present disclosure may include a light emitting element ED including an anode 150a (150b, 150c, and 150d), an emission layer 170, and a cathode 200, a reference line RL overlapping the anodes 150a, 150b, 150c, and 150d, and a passivation layer 1600 provided between the anode 150a and the reference line RL and having at least one breakdown part (BD in FIG. 7) in a first region R1 where the anodes 150a, 150b, 150c, and 150d and the reference line RL overlap.

In FIG. 6, a structure in which the anode 150a, which is an overlapping target, and the reference line RL overlap in the formation of the switch SW are specifically illustrated and other components are omitted. As shown in the first sub-pixel SP1, the pixel circuit PC of each sub-pixel may include a sensing transistor SE using the reference line RL as a second electrode and having a first electrode (refer to N1c in FIG. 2) connected to the anode 150a (refer to N1a in FIG. 2), a driving transistor DR having a third electrode (refer to N1b in FIG. 2) connected to the anode 150a and a fourth electrode connected to a driving voltage line (refer to VDL in FIG. 2), and a switching transistor ST having a fifth electrode connected to a data line and a sixth electrode a gate electrode of the driving transistor.

As illustrated in FIG. 6, the reference line RL may extend in a vertical direction to be connected to the sensing unit (1400 in FIG. 1) and may integrally include reference line horizontal portions RL_H1 and RL_H2 overlapping the anodes 150a, 150b, 150c, and 150d to be shared by adjacent sub-pixels SP1, SP2, SP3, and SP4. The reference line horizontal portions RL_H1 and RL_H2 may have a shape in the X-axis direction and may also have bent portions along inclined portions of the anodes 150b and 150c. In some cases, a part of the reference line horizontal portions RL_H1 and RL_H2 may be used as the gate electrode of the sensing transistor SE in each sub-pixel SP.

The light emitting display device may have different areas according to colors represented by the sub-pixels SP1, SP2, SP3, and SP4, which may be adjusted by the area of the anode 150a.

The first to fourth sub-pixels SP1, SP2, SP3, and SP4 illustrated in FIG. 6 may be, for example, red, green, blue, and white sub-pixels. However, the present disclosure is not limited thereto, and sub-pixels emitting light of the same color may be disposed adjacent to each other.

In the light emitting display device of the present disclosure, the sub-pixels SP1, SP2, SP3, and SP4 may include the anodes 150a, 150b, 150c, and 150d, the reference line RL or the reference line horizontal portions RL_H1 and RL_H2, and at least one switch SW, and abnormal operation of the light emitting element ED of each of the sub-pixels SP1, SP2, SP3, and SP4 is prevented or at least reduced due to overcurrent, which in turn prevents or at least reduces an abnormal bright spot from being visually recognized.

Meanwhile, the region of the light emitting element ED in which the anode 150a, the functional layer 170, and the cathode 200 overlap in each sub-pixel may serve as a light emitting part EM. Although FIG. 5 separately illustrates the areas of the pixel circuit PC and the light emitting part EM, the present disclosure is not limited thereto. In some cases, the light emitting part EM may also be provided in an area overlapping the thin film transistors ST, DR, and SE and the lines SL, DL, SEL, VDL, and RL.

As illustrated in FIG. 7, the passivation layer 1600 may include a first insulating layer 120 having a first thickness a having breakdown characteristics against an overvoltage in the first region R1 and a second thickness h greater than the first thickness in a second region R2 around the first region R1, and a second insulating layer 130 with a planarized surface provided on the first insulating layer 120.

As illustrated in FIG. 8, the first insulating layer 120 may be a passivation layer that primarily covers thin film transistors such as the driving transistor DR, and may be a kind of inorganic insulating layer. For example, the first insulating layer 120 may include at least one of silicon dioxide (SiO2), hafnium oxide (HfO2), aluminum oxide (Al2O3), and trisilicon tetranitride (Si3N4). It is desirable that the first insulating layer 120 be an inorganic insulating layer that is advantageous in thin patterning. The first insulating layer 120 may be any one of a nitride layer, an oxide layer, or an oxynitride layer.

Breakdown of an insulating layer is a phenomenon in which, when the insulating layer is disposed between two electrodes and a strong electric field is applied across the electrodes, the insulation properties of the insulating layer are lost and ohmic contact instantaneously occurs between the two electrodes.

For example, the SiO2 film has breakdown characteristics of 2.7 Vnm−1, and when it is formed to a thickness of 10 nm and a high voltage of 27 V or more acts as an electric field across upper and lower electrodes having the SiO2 layer interposed therebetween, the SiO2 layer breaks down and loses the insulation properties thereof, and thus the upper and lower electrodes can be electrically connected. The HfO2 layer has breakdown characteristics (2.7 Vnm−1 or less) similar to or lower than that of the SiO2 layer and exhibits sensitive breakdown characteristics at a lower voltage at the same thickness as the SiO2 layer. The Al2O3 layer and the Si3N4 layer exhibit breakdown characteristics (exceeding 2.7 Vnm−1) higher than that of the SiO2 layer, and thus they break down at a higher voltage at the same thickness as the SiO2 layer or at a higher voltage similar to a voltage at which the SiO2 layer breaks down when the thickness is less than that of the SiO2 layer. The present disclosure is not limited to the presented insulating layer, and any insulating layer can be used as long as it can be formed thin in the first region R1 defined as the switch and has the breakdown characteristics.

As shown in FIG. 7, in the light emitting display device of the present disclosure, the first node N1 of the switch SW is used as the anode 150*a* in the first region R1, the second node N2 is used as the reference line RL or the reference line horizontal portion RL_H1, and the thin first insulating layer 120 is provided between the overlapping anode 150*a* and reference line RL or reference line horizontal portion RL_H1 in the first region R1. The thickness of the first insulating layer 120 in the first region R1 may depend on the breakdown characteristics of the component of the first insulating layer and a high voltage to be sensed. For example, when the first insulating layer 120 is a SiO2 layer or a HfO2 layer, the thickness of the first region R1 may be 20 nm or less. When the first insulating layer 120 is an Al2O3 layer or a Si3N4 layer, the thickness of the first region R1 may be 100 nm or less.

In some cases, a thin first layer having breakdown characteristics against high voltages is formed in both the first region R1 and the second region R2, and an inorganic insulating layer is additionally formed as a second layer only in the second region R2 except the first region R1 to adjust the thickness of the second region R2 to h which can maintain interlayer insulation. In this case, the thickness h−a of the inorganic insulating layer of the second layer selectively formed in the second region R2 may be greater than the thickness of the first layer.

The second insulating layer 130 on the first insulating layer 120 is formed on parts other than parts directly connected to the anode 150*a*?, such as the third electrode N1*b* of the driving transistor DR, and the switch SW, and has the interlayer insulation characteristic in regions other than the connected parts (refer to DTC in FIG. 8) and the switch SW.

The second insulating layer 130 may have a tip HT contacting the top surface of the first insulating layer 120 such that a partial region within the first region R1 becomes the breakdown part BD to efficiently discharge electrons of overcurrent from the anode 150*a* to the reference line horizontal region RL_H1. The tip HT in the second insulating layer 130 may have a shape of a polygonal pyramid or a cone in which the lower width CTP thereof that contacts the first insulating layer 120 is narrower than the open area of the upper surface of the second insulating layer 130 when viewed in a cross section. The tip HT may have a conical shape of a polygonal pyramid shape when viewed in a three-dimension, may have a conical shape when the lower width CTP that contacts the upper surface of the first insulating layer 120 is a point, or may have a truncated conical shape or a polygonal truncated conical shape when having a predetermined width or area.

When the breakdown part BD is provided locally in the first region R1, overcurrent in the anode 150*a* of the first node N1 can automatically escape to the reference line through the second node N2 by a switch-on operation according to the breakdown characteristics of the first insulating layer 120 due to the overcurrent.

Meanwhile, the first insulating layer 120 and the second insulating layer 130 serve to protect the driving transistor DR, the sensing transistor SE, and the switching transistor SR, and are commonly referred to as the passivation layer 1600.

The first insulating layer 120 is an inorganic insulating layer, and the second insulating layer 130 is an organic insulating layer. The second insulating layer 130 may be thicker than the first insulating layer 120 and have excellent surface planarization. The first insulating layer 120 is also called a passivation layer, and the second insulating layer 130 is also called an overcoat layer. The second insulating layer 130 may be an organic insulating layer with low dielectric constant formed of polyacrylic, benzocyclobutene (BCB), or polyamide.

In some cases, a bank (180 in FIG. 8) may be further provided between the anode 150*a* and the passivation layer 1600 in the first region R1. When the bank 180 is provided in the first region R1, the first region R1 may be located outside the light emitting part.

The tip HT of the second insulating layer 130 is defined as a shape in which the second insulating layer 130 is removed.

The lower surface of the tip HT of the second insulating layer 130 may have a narrower width than the upper surface thereof.

The anode 150*a* is provided within the tip HT of the second insulating layer 130, and may be in contact with the upper surface of the first insulating layer 120 having the first thickness a.

As illustrated in FIG. 8, the light emitting display device of the present disclosure further includes the driving transistor DR connected to the anode 150*a*, and the second region R2 of the first insulating layer 120 may protect the driving transistor DR. At the first node N1, the third electrode N1*b* of the driving transistor DR and the first electrode N1*c* of the sensing transistor SE may be integrally formed as an electrode pattern 123, and the sensing transistor SE can also be protected by the first insulating layer 120. The switching transistor ST and the storage capacitor Cst formed in the same process as that for forming the driving transistor DR and the sensing transistor SE may also be protected by the first insulating layer 120.

It is desirable that the first insulating layer 120 having first thickness a have the breakdown characteristics at a higher voltage than the operating voltage VH of the driving transistor in the first region R1 where the switch SW is defined.

A cross-sectional structure of the driving transistor DR according to an embodiment of the present disclosure will be described with reference to FIG. 8.

The driving transistor DR is provided on a predetermined portion of the substrate 100.

The substrate 100 may be at least one of a glass substrate, a plastic substrate, or a metal substrate. When transparency of the light emitting display device is considered, the substrate 100 may be a transparent substrate. In some cases, a substrate in which an inorganic insulating layer is interposed between organic transparent substrates may be used for the purposes of both flexibility and prevention or reduction of inflow of impurities from the substrate 100 to internal elements.

The driving transistor DR includes a first semiconductor layer 115*a*, a gate electrode 121 overlapping a channel region of the first semiconductor layer 115*a* having a gate insulating layer 125 interposed therebetween, and a third electrode N1*b* and a fourth electrode 122 spaced apart from the gate electrode 121 and connected to both sides of the first semiconductor layer 115*a* on a predetermined portion of the substrate 100. The third electrode N1*b* may be integrally formed by the same electrode pattern 123 as the first electrode N1*c* of the sensing transistor SE. The first electrode N1*c* and the third electrode N1*b* are integrally formed or electrically connected to have the same voltage level as the first node N1, which may be the first node N1 corresponding to one side of the switch.

The first electrode N1*c* of the sensing transistor SE may be connected to one side of a second semiconductor layer 115*b*.

A light blocking layer 105 may be provided at least below the channel of the first and second semiconductor layers 115a and 115b to prevent or at least reduce the first and second semiconductor layers 115a and 115b from being affected by light leakage in the substrate 100. In some cases, the light blocking layer 105 may be omitted.

A buffer layer 110 may be provided between the light blocking layer 105 and the first and second semiconductor layers 115a and 115b. The buffer layer 110 may prevent or at least reduce infiltration of impurities into the first and second semiconductor layers 115a and 115b through the substrate 100.

In some cases, a buffer layer may be additionally provided between the substrate 100 and the light blocking layer 105.

The first insulating layer 120 is provided with a thickness difference between the first region R1 and the second region R2. The first insulating layer 120 has the first thickness a in the first region R1 where the switch SW is defined, as illustrated in FIG. 7, and has the second thickness greater than the first thickness a in the second region R2 including a thin film transistor such as the driving transistor DR, as illustrated in FIG. 8. The third electrode N1b of the driving transistor DR and the first electrode N1c of the sensing transistor SE are electrically connected to the anode 150a as the integrated electrode pattern 123 through a pixel connection part DTC provided in the passivation layer 1600.

The pixel connection part DTC of the passivation layer 1600 and the tip HT of the second insulating layer 130 may be formed with different mask opening shapes through the same process.

As illustrated in FIG. 8, the bank 180 may overlap an edge of the anode 150a while the anode 150a exposes the light emitting part. The bank 180 may overlap the pixel circuit (PC in FIG. 2) such as the driving transistor DR.

The light emitting element ED includes the anode 150a, the functional layer 170, and the cathode 200 which are formed in an overlapping manner. As illustrated in FIGS. 6 and 8, the anodes 150a, 150b, 150c, and 150d are separated for respective sub-pixels SP1, SP2, SP3, and SP4, and the bank 180 may be provided on the edges of the anodes 150a, 150b, 150c, and 150d and between the anodes 150a, 150b, 150c, and 150d. In some cases, the bank 180 may be omitted.

The functional layer 170 may include one or more stacks having hole related layers with respect to hole transport and injection below the emission layer and electron related layers with respect to electron transport and injection on the emission layer. When the functional layer 170 includes a plurality of stacks, a charge generation layer may be included between the stacks. The charge generating layer may include a heterojunction layer of an n-type charge generating layer and a p-type charge generating layer. When a plurality of stacks is provided in the functional layer 170, different emission layers may be provided between the stacks. When three or more stacks are provided in the functional layer 170, at least two of the stacks may include emission layers emitting the same color. Different emission layers may be disposed adjacent to each other in the stack provided in the functional layer 170.

In some cases, when the functional layer 170 includes a single stack or a plurality of stacks, the functional layer 170 may have emission layers separated for each sub-pixel SP such that respective sub-pixels have emission layers emitting different colors.

The light emitting display device of the present disclosure includes an insulating layer having breakdown characteristics against overvoltage between a first node connected to an anode and a second node connected to a reference line through a switch connected to the first node and the second node, to prevent or at least reduce the overvoltage causing a bright spot from being directly transferring to the anode according to automatic switching when the overvoltage is applied. Accordingly, in a sub-pixel in which overcurrent/ overvoltage has occurred, a direct overcurrent path to the anode is blocked and the overcurrent escapes to the reference line. Therefore, the sub-pixel in which an overvoltage/ overcurrent has occurred is darkened and abnormal visual recognition by viewers can be prevented or at least reduced.

Figure 9:
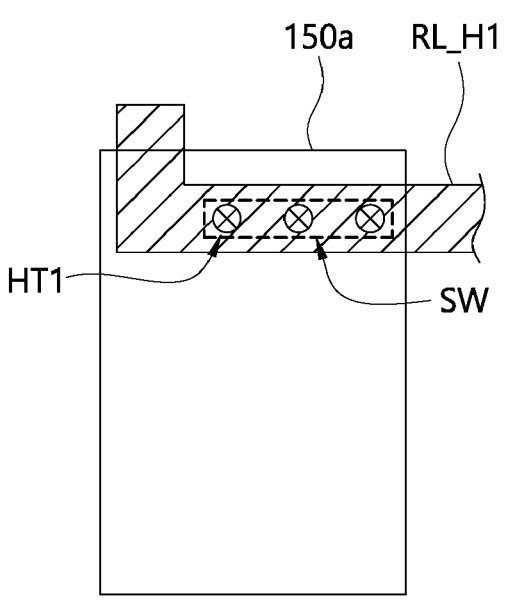
FIGS. 9 to 11 are diagrams illustrating various embodiments of the switch of the light emitting display device according to an embodiment of the present disclosure.
Figure 9:
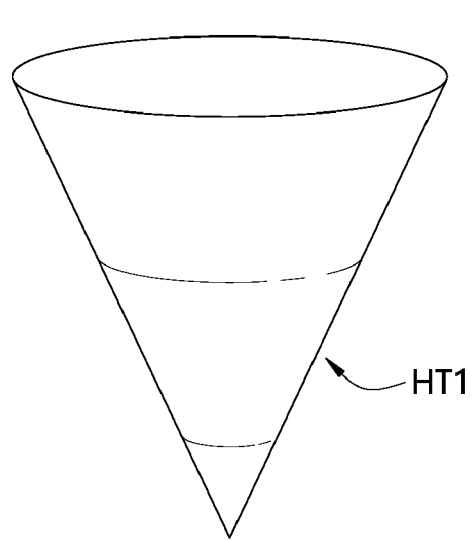
Figure 10:
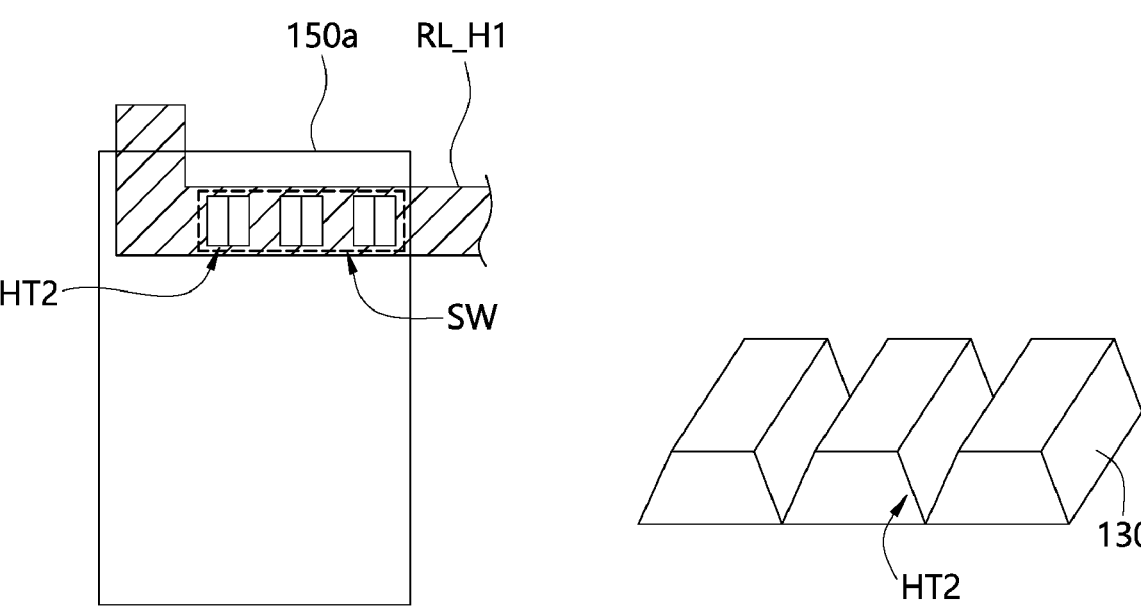
Figure 11:
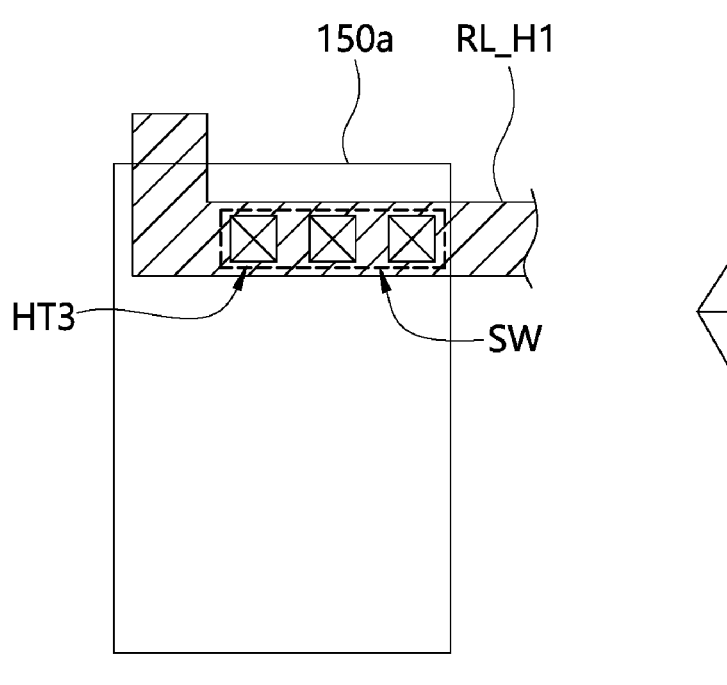
Figure 11:
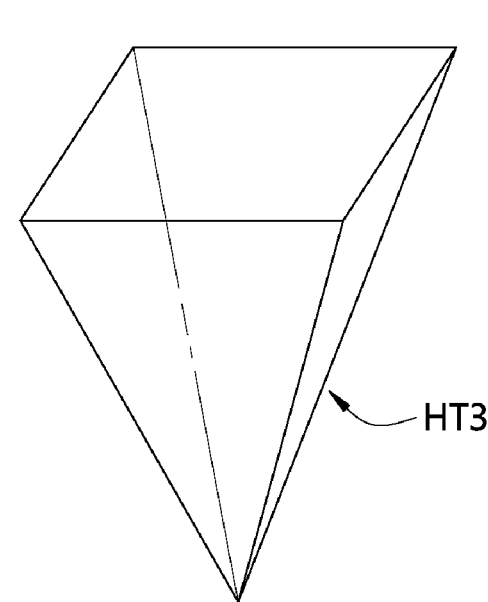

FIGS. 9 to 11 are diagrams illustrating various embodiments of the switch of the light emitting display device according to the present disclosure.

As illustrated in FIG. 9, the switch SW of the light emitting display device according to an embodiment of the present disclosure may have tips HT1 formed by selectively removing the second insulating layer 130 in a shape of a plurality of conical shapes spaced apart from each other. In this case, the tip of each conical shape faces downward and contacts the upper surface of the portion of the first insulating layer 120 having the first thickness a in FIG. 7. The anode 150a is filled at the bottom of the tip HT1 and is in contact with the upper surface of the portion of the first insulating layer 120 having the first thickness a. When an overvoltage occurs at the tip HT1, the switch is on to cause effective electron transfer due to breakdown of the first insulating layer 120.

As a modified example of the above-described example of FIG. 9, the second insulating layer 130 may be removed in a truncated conical shape instead of a conical shape. In this case, in each tip, the anode 150a and the upper surface of the first insulating layer 120 are connected in a larger area than that in the case of the conical shape.

As illustrated in FIG. 10, the switch SW of the light emitting display device according to an embodiment of the present disclosure may have tips HT2 formed by selectively removing the second insulating layer 130 in a shape of a plurality of triangular prism. In this case, the edges of the triangular prisms contact the upper surface of the portion of the first insulating layer 120 having the first thickness a in FIG. 7 in a line shape. The anode 150a is provided at the bottom of the tips HT2 and is in contact with the upper surface of the portion of the first insulating layer 120 having the first thickness in a line shape. When overvoltage occurs in the tips HT2, the switch is on to cause effective electron transfer due to breakdown of the insulating layer 120.

As illustrated in FIG. 11, the switch SW of the light emitting display device according to an embodiment of the present disclosure may have tips HT3 formed by selectively removing the second insulating layer 130 in a shape of a plurality of quadrangular pyramids spaced apart from each other. In this case, the tip of each quadrangular pyramid contacts the upper surface of the portion of the first insulating layer 120 having the first thickness a in FIG. 7 in a line shape. The anode 150a is provided at the bottom of the tips HT3 and is in contact with the upper surface of the portion of the first insulating layer 120 having the first thickness at a point. When overvoltage occurs in the tips HT3, the switch is on to cause effective electron transfer due to breakdown of the insulating layer 120.

As a modified example of the above-described example of FIG. 11, the second insulating layer 130 may be removed in a quadrangular truncated pyramid shape instead of a quadrangular pyramid shape. In this case, in each tip, the anode 150a and the supper surface of the first insulating layer 120 are connected in an area larger than that in the case of the quadrangular pyramid shape.

The present disclosure is not limited to the above examples, and a tip shape formed by removing the second insulating layer 130 in the switch SW may be a polygonal pyramid or polygonal truncated pyramid which are not described above.

The light emitting display device of the present disclosure includes an overlapping anode and reference line, and a thin insulating layer having the breakdown characteristics against an overvoltage or overcurrent in the overlapping region. Accordingly, in an overcurrent situation, the overlapping portion of the anode and the reference line is automatically switched on, allowing the overcurrent to escape to the reference line, preventing or at least reducing a bright spot of a light emitting element of a sub-pixel in an overcurrent state, and blackening the sub-pixel.

In addition, a tip structure narrowing toward the thin insulating layer within a passivation layer such that the automatic switch function is concentrated on a specific portion in case of overcurrent is provided, and the anode is in contact with the upper surface of the thin insulating layer in the tip structure. Accordingly, effective movement of electrons is possible along a short path in case of overcurrent in the tip structure.

In the light emitting display device of the present disclosure, an overvoltage prevention switch is added to prevent or at least reduce occurrence of defective bright spots in the light emitting element due to overcurrent or overvoltage.

The overcurrent or overvoltage prevention switch takes advantage of the breakdown properties of materials and may have modified structures to maximize or at least increase the effects thereof.

When overcurrent or overvoltage that causes a bright spot, the switch is automatically on in the reference line overlapping the anode due to the breakdown characteristics of the insulating layer, thereby changing the light emitting element in which the overcurrent has occurred to a dark spot. Accordingly, when a bright spot occurs, a defect in visibility is prevented or at least reduced.

According to structural change of the overlapping portion of the reference line and the anode, overcurrent escapes through the reference line when the overcurrent occurs, and thus the corresponding light emitting element can be darkened.

The thickness of the first insulating layer on the reference line is selectively reduced such that the anode contacts the upper surface of the portion of the first insulating layer having a reduced thickness in a partial region. Accordingly, overcurrent causes breakdown in the region of the passivation layer having the reduced thickness to cause switch on.

In order to maintain the insulating property in the remaining region of the first insulating layer other than the region where overcurrent causes breakdown of the first insulating layer, the second insulating layer having a planarization characteristic and a low dielectric constant is provided between the region of the first insulating layer having the reduced thickness and the anode.

When the tip structure is formed in the second insulating layer, a breakdown voltage may be reduced at the edge, and thus the thickness of the passivation layer may be increased in the remaining region.

A breakdown point may be set on the reference line for each sub-pixel to enable overcurrent sensing for each sub-pixel.

In the display device of the present disclosure, when overcurrent occurs in a pixel driving circuit, a current path is formed such that the overcurrent can escape through the reference line, and the corresponding anode can receive the ground voltage applied to the reference line to be expressed as a dark spot.

Since the density increases at the tip in the tip-shaped structure, the boosting force capable of attracting other charges relatively increases, and thus a detectable overvoltage level can be lowered. That is, even if the first thickness of the first insulating layer is not reduced, it is possible to detect overcurrent and overvoltage causing bright spots in sub-pixels.

The light emitting display device of the present disclosure may include a light emitting element including an anode, an emission layer, and a cathode, a reference line overlapping the anode, and a passivation layer provided between the anode and the reference line and having at least one breakdown part in a first region where the anode and the reference line overlap.

A light emitting display device according to one or more aspects of the present disclosure may comprise a light emitting element including an anode, an emission layer, and a cathode, a reference line overlapping the anode and a passivation layer provided between the anode and the reference line and having at least one breakdown part at a first region where the anode and the reference line overlap.

In a light emitting display device according to one or more aspects of the present disclosure, the passivation layer may include a first insulating layer having a first thickness at the first region and a second thickness greater than the first thickness at a second region around the first region, and a second insulting layer having a planarized surface disposed on the first insulating layer.

In a light emitting display device according to one or more aspects of the present disclosure, the second insulating layer may have a tip contacting an upper surface of the first insulating layer at the breakdown part.

In a light emitting display device according to one or more aspects of the present disclosure, the tip of the second insulating layer may be provided where the second insulating layer is removed.

In a light emitting display device according to one or more aspects of the present disclosure, a lower surface of the tip of the second insulating film may be narrower than an upper surface of the tip.

In a light emitting display device according to one or more aspects of the present disclosure, the anode may be provided within the tip of the second insulating layer. The anode may be in contact with an upper surface of the portion of the first insulating layer having the first thickness.

A light emitting display device according to one or more aspects of the present disclosure may further comprise a thin film transistor connected to the anode. The second region of the first insulating film may protect the thin film transistor.

In a light emitting display device according to one or more aspects of the present disclosure, the first insulating film may be an inorganic insulating film, and the second insulating film may be an organic insulating film. The first thickness of the first insulating layer may have breakdown characteristics at a higher voltage than an operating voltage of the thin film transistor.

In a light emitting display device according to one or more aspects of the present disclosure, the first insulating film may include a first layer provided at both the first region and the second region, and a second layer selectively provided only at the second region.

In a light emitting display device according to one or more aspects of the present disclosure, the second layer may be thicker than the first layer.

In a light emitting display device according to one or more aspects of the present disclosure, the first insulating layer may comprise at least one of $SiO_2$, $HfO_2$, $Al_2O_3$, and $Si_3N_4$.

In a light emitting display device according to one or more aspects of the present disclosure, the reference line may include a first forming portion extending in a first direction and connected to a driver, and a second forming portion extending in a direction intersecting the first direction and overlapping the anode.

A light emitting display device according to one or more aspects of the present disclosure may comprise a light emitting element including an anode, an emission layer and a cathode, a driving transistor connected to the anode to apply a driving current to the light emitting element at a first node, a reference line spaced apart from the first node, having a second node, and overlapping the anode and a passivation layer provided between the anode and the reference line. In a light emitting display device according to one or more aspects of the present disclosure, a switch disposed between the first node and the second node may be provided in the passivation layer.

In a light emitting display device according to one or more aspects of the present disclosure, when overcurrent occurs in the driving transistor, the passivation layer may connect the first node and the second node according to breakdown characteristics.

In a light emitting display device according to one or more aspects of the present disclosure, in the passivation layer, an upper surface of the anode overlapping the reference line at the second node may be lower than an upper surface of the anode at a light emitting part.

In a light emitting display device according to one or more aspects of the present disclosure, the passivation layer may include a first insulating film having a first thickness at a first region between the first node and the second node and a second thickness greater than the first thickness at a second region around the first region, and a second insulating layer having a planarized surface disposed on the first insulating layer.

In a light emitting display device according to one or more aspects of the present disclosure, the second insulating layer may have a tip contacting an upper surface of the first insulating layer between the first node and the second node.

In a light emitting display device according to one or more aspects of the present disclosure, the anode may be provided within the tip of the second insulating layer. The anode may be in contact with an upper surface of the portion of the first insulating layer having the first thickness.

A light emitting display device according to one or more aspects of the present disclosure may further comprise a sensing transistor between the first node and the second node.

In a light emitting display device according to one or more aspects of the present disclosure, the first insulating film is an inorganic insulating film, the second insulating film is an organic insulating film. The first thickness of the first insulating layer may have breakdown characteristics at a higher voltage than an operating voltage of the driving transistor.

The light emitting display device of the present disclosure has the following effects.

First, the light emitting display device of the present disclosure includes a thin insulating layer having breakdown characteristics against overvoltage or overcurrent, formed in a region where an anode and a reference line overlap. Accordingly, in an overcurrent situation, the overlapping portion of the anode the reference line automatically becomes a switch on state, allowing the overcurrent to escape through the reference line, to prevent or at least reduce and darken a bright spot in a light emitting element in a sub-pixel in an overcurrent state.

Second, the light emitting display device has a tip structure that narrows toward a thin insulating layer within the passivation layer such that the automatic switch function is concentrated on a specific portion in case of overcurrent, and the anode contacts the upper surface of the thin insulating layer within the tip structure. Accordingly, electrons can effectively move through a short path in the tip structure in case of overcurrent.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A light emitting display device comprising:
   a light emitting element including an anode, an emission layer, and a cathode;
   a reference line overlapping the anode; and
   a passivation layer between the anode and the reference line, the passivation layer including at least one breakdown part in a first region where the anode and the reference line overlap each other.

2. The light emitting display device of claim 1, wherein the passivation layer includes:
   a first insulating layer having a first thickness in the first region and a second thickness that is greater than the first thickness in a second region, the second region surrounding the first region, and
   a second insulating layer having a planarized surface on the first insulating layer.

3. The light emitting display device of claim 2, wherein the second insulating layer includes a tip, the tip in contact with an upper surface of the first insulating layer at the at least one breakdown part.

4. The light emitting display device of claim 3, wherein the tip of the second insulating layer is provided where the second insulating layer is removed.

5. The light emitting display device of claim 3, wherein a lower surface of the tip of the second insulating layer is narrower than an upper surface of the tip.

6. The light emitting display device of claim 3, wherein the anode is in the tip of the second insulating layer, and the anode is in contact with an upper surface of a portion of the first insulating layer that has the first thickness.

7. The light emitting display device of claim 2, further comprising:
   a thin film transistor connected to the anode,
   wherein the first insulating layer in the second region protects the thin film transistor.

8. The light emitting display device of claim 7,
   wherein the first insulating layer is an inorganic insulating film, and the second insulating layer is an organic insulating film, and
   wherein a portion of the first insulating layer that has a first thickness has breakdown characteristics at a voltage that is higher than an operating voltage of the thin film transistor.

9. The light emitting display device of claim 2, wherein the first insulating layer includes a first layer extending across the first region and the second region of the first insulating layer, and a second layer in the second region but not the first region.

10. The light emitting display device of claim 9, wherein the second layer is thicker than the first layer.

11. The light emitting display device of claim 2, wherein the first insulating layer includes at least one of silicon dioxide ($SiO_2$), hafnium oxide ($HfO_2$), aluminum oxide ($Al_2O_3$), or trisilicon tetranitride ($Si_3N_4$).

12. The light emitting display device of claim 1, wherein the reference line comprises:

a first forming portion extending in a first direction, the first forming portion electrically connected to a driver, and a second forming portion extending in a direction intersecting the first direction, the second forming portion overlapping the anode.

13. A light emitting display device comprising:

a light emitting element including an anode, an emission layer and a cathode;

a driving transistor connected to the anode, the driving transistor configured to apply a driving current to the light emitting element at a first node;

a reference line spaced apart from the first node, the reference line including a second node and the reference line overlapping the anode; and a passivation layer between the anode and the reference line, wherein a switch is between the first node and the second node in the passivation layer.

14. The light emitting display device of claim 13, wherein responsive to occurrence of overcurrent in the driving transistor, the passivation layer connects the first node and the second node according to breakdown characteristics.

15. The light emitting display device of claim 13, wherein in the passivation layer, an upper surface of the anode overlapping the reference line at the second node is lower than an upper surface of the anode at a light emitting part.

16. The light emitting display device of claim 13, wherein the passivation layer includes:

a first insulating layer, the first insulating layer having a first thickness in a first region between the first node and the second node, and a second thickness that is greater than the first thickness in a second region surrounding the first region, and a second insulating layer including a planarized surface on the first insulating layer.

17. The light emitting display device of claim 16, wherein the second insulating layer includes a tip that is in contact with a portion of an upper surface of the first insulating layer between the first node and the second node.

18. The light emitting display device of claim 17, wherein the anode is in the tip of the second insulating layer, and the anode is in contact with an upper surface of the portion of the first insulating layer that has the first thickness.

19. The light emitting display device of claim 13, further comprising:

a sensing transistor between the first node and the second node.

20. The light emitting display device of claim 16, wherein the first insulating layer is an inorganic insulating film, and the second insulating layer is an organic insulating film, and wherein a portion of the first insulating layer that has the first thickness has breakdown characteristics at a voltage that is higher than an operating voltage of the driving transistor.

* * * * *